United States Patent
Li et al.

(10) Patent No.: US 10,191,231 B2
(45) Date of Patent: Jan. 29, 2019

(54) ENHANCING THE BANDWIDTH OF LIGHT SENSORS ON PLANAR OPTICAL DEVICES COMPRISING A LIGHT SENSOR CONFIGURED TO OUTPUT A PASSED LIGHT SIGNAL AND TO RECEIVE AT LEAST A PORTION OF THE PASSED LIGHT SIGNAL

(71) Applicant: Kotura, Inc., Monterey Park, CA (US)

(72) Inventors: Zhi Li, Alhambra, CA (US); Dazeng Feng, El Monte, CA (US); Jacob Levy, Sierra Madre, CA (US); Mohammad Esmaeili Rad, Pasadena, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 0 days.

(21) Appl. No.: 14/853,602

(22) Filed: Sep. 14, 2015

(65) Prior Publication Data
US 2017/0075078 A1 Mar. 16, 2017

(51) Int. Cl.
*G02B 6/00* (2006.01)
*G02B 6/42* (2006.01)
*G02B 6/12* (2006.01)
*G02B 6/122* (2006.01)
*H01L 31/028* (2006.01)
*H01L 31/0232* (2014.01)

(52) U.S. Cl.
CPC ............ *G02B 6/4206* (2013.01); *G02B 6/00* (2013.01); *G02B 6/12004* (2013.01); *G02B 6/1228* (2013.01); *G02B 6/4214* (2013.01); *G02B 6/4257* (2013.01); *H01L 31/028* (2013.01); *H01L 31/0232* (2013.01); *H01L 31/02327* (2013.01); *G02B 2006/12097* (2013.01)

(58) Field of Classification Search
CPC ........ G01B 11/14; G01B 11/00; G02B 26/10; G02B 27/0093; G02B 17/023; G02B 26/124; G02B 6/12004; G02B 6/00; G02B 6/1228; G02B 6/4214; H01L 31/02327
USPC ................................. 250/551, 227.14–227.17
See application file for complete search history.

(56) References Cited

U.S. PATENT DOCUMENTS

| | | | | |
|---|---|---|---|---|
| 5,404,001 | A * | 4/1995 | Bard | G06K 7/10653 235/439 |
| 5,633,494 | A * | 5/1997 | Danisch | G02B 6/02057 250/227.14 |
| 5,663,821 | A * | 9/1997 | Suda | G02B 6/4246 257/81 |
| 6,933,491 | B2 * | 8/2005 | Maida, Jr. | E21B 47/123 250/227.14 |

* cited by examiner

*Primary Examiner* — Que T Le
(74) *Attorney, Agent, or Firm* — Gavrilovich, Dodd & Lindsey, LLP (57) ABSTRACT

The optical device includes a light sensor positioned on a base. The light sensor is configured to receive an input light signal and outputs a passed light signal that includes light from the input light signal. The optical device also includes a return system located on the base. The return system is configured to receive the passed light signal from the light sensor and to return at least a portion of the light from the passed light signal back to the light sensor.

20 Claims, 9 Drawing Sheets

Figure 8B

ENHANCING THE BANDWIDTH OF LIGHT SENSORS ON PLANAR OPTICAL DEVICES COMPRISING A LIGHT SENSOR CONFIGURED TO OUTPUT A PASSED LIGHT SIGNAL AND TO RECEIVE AT LEAST A PORTION OF THE PASSED LIGHT SIGNAL

FIELD

The present invention relates to optical devices and more particularly to devices having a light sensor.

BACKGROUND

The use of optical and/or optoelectronic devices is increasing in communications applications. These devices can include light sensors that receive light signals from a waveguide. These light sensors use a light-absorbing medium that absorbs light received at the light sensor. The bandwidth of the light sensor is the range of wavelengths that can effectively be detected by the light sensor. The bandwidth of the light sensor is generally determined by the material used for the light-absorbing medium. For instance, many light sensors use germanium for the light-absorbing medium.

Light used for communications applications typically has a wavelength in the range of 1500-1600 nm. However, when the wavelength becomes longer than 1550 nm, the absorption of light by germanium decreases because the photon energy falls below the germanium bandgap. As a result, the light sensors that use germanium for detection of wavelengths longer than 1550 nm are typically long and/or use thick layers of germanium in order to increase the opportunity for the germanium to absorb the light. However, increasing the length and/or thickness of the germanium increases the capacitance of the light sensor and accordingly ends up reducing the bandwidth of the light sensor. As a result, there is a need for a light sensor construction that improves bandwidth without increasing capacitance.

SUMMARY

The optical device includes a light sensor positioned on a base. The light sensor is configured to receive an input light signal and outputs a passed light signal that includes light from the input light signal. The optical device also includes a return system located on the base. The return system receives the passed light signal from the light sensor and returns at least a portion of the light from the passed light signal back to the light sensor.

BRIEF DESCRIPTION OF THE FIGURES

FIG. 1A through FIG. 1K illustrate optical devices having a light sensor configured to receive light signals from a waveguide. At least a portion of the light signal passes through the sensor and is output from the sensor as a passed signal. The passed signal is received at a return system that returns at least a portion of the light in the passed signal to the light sensor.

FIG. 4A and FIG. 4B illustrate the dimensions and construction of an abrupt taper according to FIG. 3.

FIG. 8A and FIG. 8B illustrates another embodiment of a device with a return system that returns at least a portion of the light output from a light sensor back to the light sensor.

DESCRIPTION

An optical device includes a light sensor positioned on a base. The light sensor receives an input light signal and outputs a passed light signal that includes light from the input light signal. The optical device also includes a return system located on the base. The return system receives the passed light signal from the light sensor and returns at least a portion of the light from the passed light signal back to the light sensor. Returning the light to the sensor increases the opportunity for the sensor to detect and/or absorb the light that was previously passed through the sensor and effectively increases the length of the light sensor. An effective increase in the length increases the bandwidth of the sensor without an actual increase in the length of the sensor. As a result, the increased bandwidth is achieved without increasing the capacitance of the sensor.

Figure 1A:
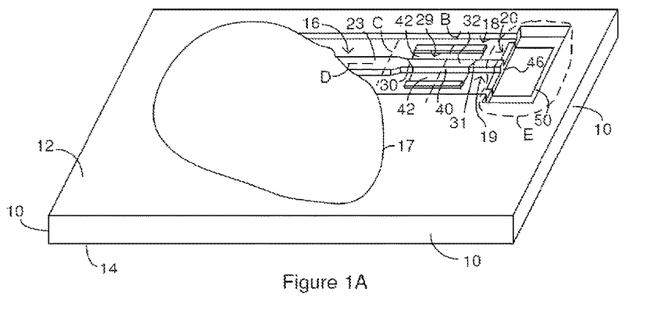
Figure 1B:
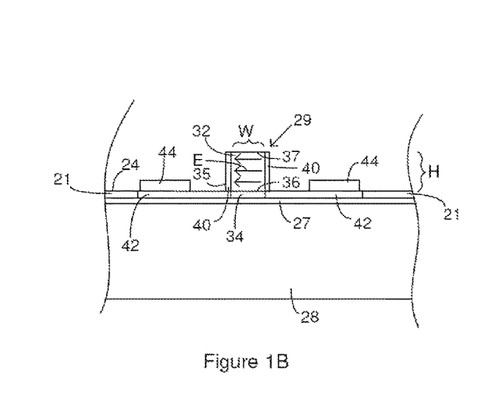
FIG. 1B is a cross-section of the device shown in FIG. 1A taken along the line labeled B.
Figure 1C:
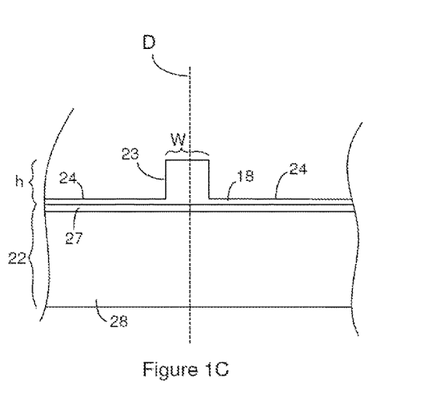
FIG. 1C is a cross-section of the device shown in FIG. 1A taken along the line labeled C.
Figure 1D:
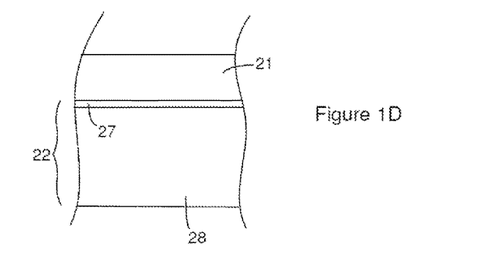
FIG. 1D is a cross-section of the optical device shown in FIG. 1C taken along the line labeled D and extending parallel to the longitudinal axis of the waveguide.
Figure 1E:
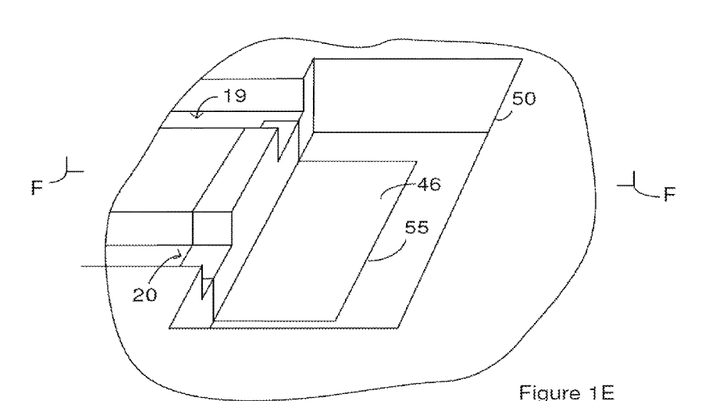
FIG. 1E is a perspective view of the portion of the device within the circle labeled E in FIG. 1A.
Figure 1F:
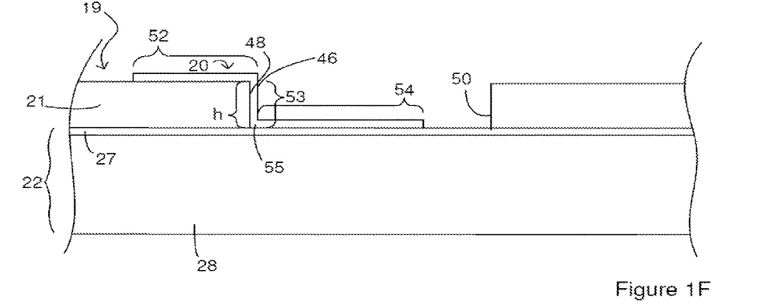
FIG. 1F is a cross section of a portion of the device shown in FIG. 1E taken along a line extending between the Brackets labeled F in FIG. 1E.

FIG. 1A through FIG. 1D illustrate an optical device having a light sensor configured to receive light signals from a waveguide. FIG. 1A is a perspective view of the device. FIG. 1B is a cross-section of the light sensor. For instance, FIG. 1B is a cross-section of the device shown in FIG. 1A taken along the line labeled B. FIG. 1C is a cross-section of the waveguide. For instance, FIG. 1C is a cross-section of the device shown in FIG. 1A taken along the line labeled C. FIG. 1D is a cross-section of the optical device shown in FIG. 1C taken along the line labeled D and extending parallel to the longitudinal axis of the waveguide. FIG. 1E is a perspective view of the portion of the device within the circle labeled E in FIG. 1A. FIG. 1F is a cross section of a portion of the device shown in FIG. 1E taken along a line extending between the Brackets labeled F in FIG. 1E.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more input waveguides 16 that carry input light signals from one or more optical components 17 to a light sensor 18. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert a light signal to an electrical signal, vias that provide an optical pathway for a light signal traveling through the device from the bottom side 14 of the device to the top side 12 of the device, and optical fibers that carry light signals to and/or from the optical device. Additionally, the device can optionally, include electrical components. For instance, the device can include electrical connections for applying a potential or current to a waveguide and/or for controlling other components on the optical device.

During operation of the light sensor, the light sensor generally absorbs only a portion of the input light signal but can absorb all of the light signal. Accordingly, the input light signal loses intensity as it travels through the light sensor. Light that is not absorbed by the light sensor is output from the light sensor as a passed light signal. The device includes a return system that receives the passed light signal and returns at least a portion of the passed light signal back to the light sensor. A suitable return system includes one or more return waveguides 19 and one or more return devices 20.

The illustrated return system includes a return waveguide 19 that receives the passed light signal from the light sensor 18. The return waveguide 19 guides the passed light signal to the return device 20 which returns at least a portion of the passed light signal to the light sensor 18. In some instances, the return device 20 returns the passed light signal to the return waveguide 19. For instance, the return device 20 can reflect at least a portion of the passed light signal back into the return waveguide 19. The portion of the passed light signal returned to the return waveguide serves as the return signal. The return waveguide 19 can guide the return signal back to the light sensor 18.

The waveguide 16 and the return waveguide 19 are defined in a light-transmitting medium 21 positioned on a base 22. For instance, the waveguide 16 and the return waveguide 19 are partially defined by a ridge 23 extending upward from a slab region of the light-transmitting medium 21. In some instances, the top of the slab region is defined by the bottom of trenches 24 extending partially into the light-transmitting medium 21 or through the light-transmitting medium 21. Suitable light-transmitting media include, but are not limited to, silicon, polymers, silica, SiN, GaAs, InP and $LiNbO_3$. One or more cladding layers (not shown) are optionally positioned on the light-transmitting medium. The one or more cladding layers can serve as a cladding for the waveguide 16 and/or for the device.

The portion of the base 22 adjacent to the light-transmitting medium 21 is configured to reflect light signals from the waveguide 16 back into the waveguide 16 in order to constrain light signals in the waveguide 16 and the return waveguide 19. For instance, the portion of the base 22 adjacent to the light-transmitting medium 21 can be an optical insulator 27 with a lower index of refraction than the light-transmitting medium 21. The drop in the index of refraction can cause reflection of a light signal from the light-transmitting medium 21 back into the light-transmitting medium 21. The base 22 can include the optical insulator 27 positioned on a substrate 28. As will become evident below, the substrate 28 can be configured to transmit light signals. For instance, the substrate 28 can be constructed of a light-transmitting medium 21 that is different from the light-transmitting medium 21 or the same as the light-transmitting medium 21. In one example, the device is constructed on a silicon-on-insulator wafer. A silicon-on-insulator wafer includes a silicon layer that serves as the light-transmitting medium 21. The silicon-on-insulator wafer also includes a layer of silica positioned on a silicon substrate. The layer of silica can serve as the optical insulator 27 and the silicon substrate can serve as the substrate 28.

The light sensor 18 includes a sensor waveguide 29 that receives the input light signal from the one or more waveguides 16 through an input facet 30. The light sensor 18 is configured to convert the light signal to an electrical signal. Accordingly, the light signal can be employed to detect receipt of light signals. For instance, the light sensor 18 can be employed to measure the intensity of a light signal and/or power of a light signal. Conversion of the light signal to the electrical signal includes absorption of the light signal by the light sensor. When the light sensor absorbs only a portion of the light signal, the light sensor outputs the unabsorbed portion of the light signal through an output facet 31 of the sensor waveguide 29. The portion of the light signal that passes through the output facet 31 serves as the passed light signal that is received by the return waveguide 19. Although FIG. 1A illustrates a waveguide 16 carrying the light signal between the one or more components and the light sensor 18, the device can be constructed such that the waveguide 16 carries the light signal directly from an optical fiber to the light sensor 18 or such that the sensor waveguide 29 receives the input light signal directly from an optical fiber.

The sensor waveguide 29 includes a light-absorbing medium 32 that absorbs light signals. The light-absorbing medium 32 is positioned to receive at least a portion of the light signal guided through the sensor waveguide 29. For instance, the sensor and/or the sensor waveguide 29 can include a ridge 23 of the light-absorbing medium 32 as shown in FIG. 1B. Accordingly, the ridge of the light-absorbing medium 32 can define all or a portion of the sensor waveguide 29.

As is evident from FIG. 1A, when the ridge of the light-absorbing medium 32 define the sensor waveguide 29, the light-absorbing medium 32 can define the input facet 30 and the output facet 31 of the sensor waveguide 29. As a result, there is an interface between the input facet 30 of the light-absorbing medium 32 and a facet of the light-transmitting medium 21 and between the output facet 31 of the light-absorbing medium 32 and a facet of the light-transmitting medium 21. One or more of the interfaces can have an angle that is non-perpendicular relative to the direction of propagation of light signals through the waveguide 16 at the interface. In some instances, the interface is substantially perpendicular relative to the base 22 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The light-absorbing medium 32 of the light sensor 18 is positioned on a seed portion 34 of the light-transmitting medium 21. The seed portion 34 of the light-transmitting medium 21 is positioned on the base 22. In particular, the seed portion 34 of the light-transmitting medium 21 contacts the insulator 27. The seed portion 34 of the light-transmitting medium 21 can be continuous with the light-transmitting medium 21 included in the waveguide 16 or spaced apart from the waveguide 16. When the light signal enters the light sensor, a portion of the light signal can enter the seed portion 34 of the light-transmitting medium 21 and another portion of the light signal enters the light-absorbing medium 32. Accordingly, the light-absorbing medium 32 can receive only a portion of the light signal. In some instances, the light sensor can be configured such that the light-absorbing material receives the entire light signal.

During the fabrication of the device, the seed portion 34 of the light-transmitting medium 21 can be used to grow the light-absorbing medium 32. For instance, when the light-transmitting medium 21 is silicon and the light-absorbing medium 32 is germanium, the germanium can be grown on the silicon. As a result, the use of the light-transmitting medium 21 in both the waveguides 16 and as a seed layer for growth of the light-absorbing medium 32 can simplify the process for fabricating the device.

During operation of the light sensor 18, a reverse bias electrical field is applied across the light-absorbing medium 32. When the light-absorbing medium 32 absorbs a light signal, an electrical current flows through the light-absorbing medium 32. As a result, the level of electrical current through the light-absorbing medium 32 indicates receipt of a light signal. Additionally, the magnitude of the current can indicate the power and/or intensity of the light signal. Different light-absorbing media 32 can absorb different wavelengths and are accordingly suitable for use in a light sensor 18 depending on the function of the light sensor 18. A light-absorbing medium 32 that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1650 nm.

The light sensor can be configured to apply an electric field to the light-absorbing medium 32 that is substantially parallel to the base 22. For instance, the light-absorbing medium 32 can include lateral sides 35 that connect a bottom side 36 and a top side 37. The bottom side is located between the top side and the base 22. In some instances, the lateral sides are substantially perpendicular relative to the base 22.

The lateral sides of the light-absorbing medium 32 can include doped regions 40. As is evident from FIG. 1B, each of the doped regions 40 can extend up to the top side of the light-absorbing medium 32. Each of the doped regions 40 can be an N-type doped regions or a P-type doped region. For instance, each of the N-type doped regions can include an N-type dopant and each of the P-type doped regions can include a P-type dopant. In some instances, the light-absorbing medium 32 includes a doped region 40 that is an N-type doped region and a doped region 40 that is a P-type doped region. The separation between the doped regions 40 in the light-absorbing medium 32 results in the formation of PIN (p-type region-insulator-n-type region) junction in the light sensor 18.

In the light-absorbing medium 32, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$. A suitable concentration for the N-type dopant in an N-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$.

The light-transmitting medium 21 also includes doped regions 42. Each doped region 42 in the light-transmitting medium 21 contacts one of the doped regions 40 in the light-absorbing medium 32. A doped region 42 in the light-transmitting medium 21 and the contacted doped region 40 are the same type of doped region. For instance, when a doped region 40 in the light-absorbing medium 32 is a P-type region, that doped region 40 contacts a P-type doped region in the light-transmitting medium 21. As a result, in some instances, one of the doped regions 42 in the light-transmitting medium 21 is a P-type doped region and one of the doped regions 42 in the light-transmitting medium 21 is an N-type doped region.

In the light-transmitting medium 21, suitable dopants for N-type regions include, but are not limited to, phosphorus and/or arsenic. Suitable dopants for P-type regions include, but are not limited to, boron. The doped regions 42 are doped so as to be electrically conducting. A suitable concentration for the P-type dopant in a P-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$. A suitable concentration for the N-type dopant in an N-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$.

Each doped region 42 in the light-transmitting medium 21 is in contact with an electrical conductor 44 such as a metal. Accordingly, the each of the doped regions 42 in the light-transmitting medium 21 provides electrical communication between an electrical conductor 44 and one of the doped regions 40 in the light-absorbing medium 32. As a result, electrical energy can be applied to the electrical conductors 44 in order to apply the electric field to the light-absorbing medium 32. As is evident from the arrows labeled E in FIG. 1B, the doped regions 40 in the light-absorbing medium 32 serve as the field sources for the electrical field. As a result, the resulting electrical field is substantially parallel to the base 22.

As noted above, when the light sensor absorbs only a portion of the light signal, the light sensor outputs the unabsorbed portion of the light signal through an output facet 31 of the sensor waveguide 29. The unabsorbed portion of the light signal serves as the passed signal and at least a portion of the passed signal is received by the return waveguide 19. The return waveguide 19 guides the passed signal to the return device 20. In some instances, the return waveguide 19 excludes other optical components between the return device 20 and the light sensor 18. In these instances, the passed signal experiences no additional processing between the return device 20 and the light sensor 18. As an example, the passed signal does not experience amplification, attenuation, or modulation along the optical pathway between the return device 20 and the light sensor 18. In some instances, the return device 20 receives more than 50% of the power of the passed light signal that entered the return waveguide. The return device 20 returns at least a portion of the received portion of the passed light signal to the return waveguide 19. The return waveguide 19 guides the returned light signal toward the light sensor 18. At least a portion of the returned light signal enters the light sensor through the output facet 31 of the sensor waveguide. The sensor waveguide then guides the received portion of the returned light signal towards the input facet 30. Accordingly, the returned light signal can be fully or partially absorbed by the light-absorbing medium 32 as the light from the returned light signal travels through the light sensor a second time.

The illustrated return device 20 is positioned to receive the passed light signal from the return waveguide 19. For instance, the illustrated return device is a reflector 46 positioned on a facet 48 at a terminal end of the return waveguide 19. All or a portion of the terminal end of the return waveguide 19 can optionally be exposed by a recess 50 that extends into the light-transmitting medium 21. A side of the recess 50 can serve as the terminal end of the return waveguide 19 and can include the facet 48. FIG. 1D and FIG. 1E illustrate the recess 50 extending through the light-transmitting medium 21 to the base 22. For instance, the optical insulator 27 or substrate 28 can serve as the bottom of the recess and/or the recess 50 can be constructed so there is no light-transmitting medium 21 in the recess 50. Alternately, the recess 50 does not extend through the light-transmitting medium 21 and the recess 50 includes a layer of the light-transmitting medium 21 over the bottom of the recess 50. The recess 50 can be formed with traditional integrated circuit fabrication techniques and/or traditional optical device fabrication techniques such as etching. When the recess 50 is etched, the etch can be selected such that the optical insulator 27 acts as an etch stop.

The reflector 46 is positioned on the facet 48. The reflector 46 is shown in direct contact with the light-transmitting medium that defines the facet 48; however, as will be discussed in more detail below, the return waveguide 19 can include one or more additional layers between the light-transmitting medium and the reflector 46. The height of the facet 48 is labeled 48 in FIG. 1F. In some instances, the reflector 46 is positioned over or covers more than 20%, 50%, or 95% of the height of the facet 48.

The reflector 46 shown in FIG. 1E and FIG. 1F includes an upper region 52, a facet region 53, and a recess region 54. The upper region is positioned outside of the recess 50 and extends across the top of the light-transmitting medium 21. The facet region is positioned over the facet 48. The recess region extends away from the facet region across the bottom of the recess 50. The recess region and the upper regions are optional; however, the presence of these regions reduces alignment challenges during the fabrication of the device.

Figure 1G:
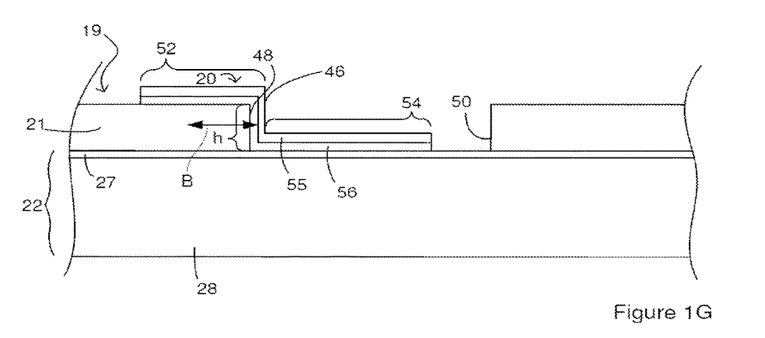
FIG. 1G is another embodiment of a cross section of a portion of the device shown in FIG. 1E taken along a line extending between the Brackets labeled F in FIG. 1E. The device includes an intermediate layer between a reflector and waveguide.

The upper region 52 of the reflector 46 is largely a result of the inaccuracies in the process of manufacturing these devices. When the reflector 46 is a metal, the upper region 52 of the reflector 46 absorbs light from the return waveguide 19 and is accordingly a source of optical loss. Further, since this optical loss is through the top of the return waveguide 19, this loss is a source of polarization dependent loss (PDL). The optical device can make use of an intermediate layer 56 to reduce these optical losses. For instance, FIG. 1G illustrates the device of FIG. 1E but with an intermediate layer 56 between the top of the return waveguide 19 and the upper region 52 of the reflector 46. The intermediate layer 56 can have an index of refraction that is less than the index of refraction of the light-transmitting medium 21. As a result of the angle at which the light signals are incident upon the upper region of the intermediate layer 56, this portion of the intermediate layer 56 acts as a waveguide cladding and can accordingly reduce interaction of the light signals with the upper region 52 of the reflector 46. As a result, this portion of the intermediate layer 56 reduces absorption of the light from the return waveguide 19 and accordingly reduces polarization dependent optical loss associated with the optical device.

In FIG. 1G, the intermediate layer 56 is between the facet 48 and the reflecting layer 46. The light signals that are traveling through waveguide 19 toward the facet 48 are transmitted through the facet 48 and then travel through the intermediate layer 56 and are reflected by a surface of the reflecting layer 46 as shown by the arrow labeled B in FIG. 1B.

Figure 1H:
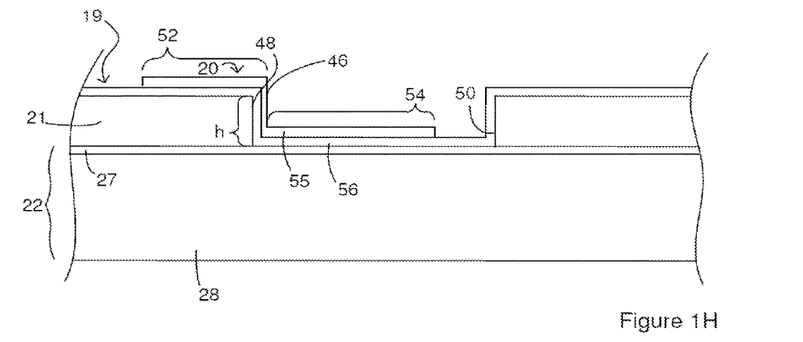
FIG. 1H is a cross section of another embodiment of FIG. 1G where the intermediate layer extends out from under the reflector and acts as a cladding for the waveguide.

The intermediate layer 56 need not be limited to a location under the reflecting layer 46 and can extend beyond the reflecting layer 46. For instance, the intermediate layer 56 can extend of the waveguide 19 and across the recess 50 as illustrated in FIG. 1H. As a result, the intermediate layer 56 can also serve as a waveguide cladding or a device cladding. The use of the intermediate layer as a cladding reduces the number of steps needed to fabricate the optical device by allowing both the intermediate layer 56 and cladding to be formed in a single step.

Figure 1I:
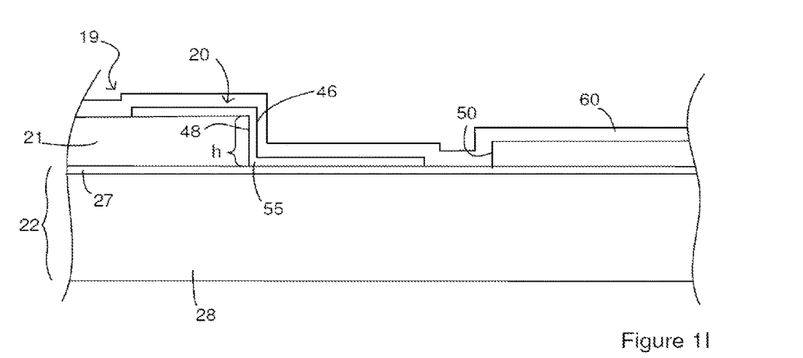
FIG. 1I illustrates the device of FIG. 1A through FIG. 1E with a cladding over the device.

A cladding 60 can be positioned over the device and/or reflecting layer 46. For instance, FIG. 1I illustrates a cladding 60 positioned over the optical device of FIG. 1F.

The thickness of the intermediate layer 56 between the reflecting layer 46 and the facet 48 can affect reflectivity at the reflecting surface. A suitable thickness for the intermediate layer 56 between the reflecting layer 46 and the facet 48 includes, but is not limited to, a thickness greater than 5 nm, or 10 nm or 15 nm and/or less than 50 nm, 100 nm, or 1000 nm. When an intermediate layer 56 is between the reflector 46 and the light-transmitting medium 21, the reflector 46 can be a distance of greater than 5 nm, or 10 nm or 15 nm and/or less than 50 nm, 100 nm, or 1000 nm from the light-transmitting medium 21.

The thickness of the upper region of the intermediate layer 56 can affect amount of light signal absorption by the upper region of the reflecting layer. For instance, reducing the thickness of the upper portion of the intermediate layer 56 can increase light signal absorption. A suitable thickness for the upper portion of the intermediate layer 56 includes, but is not limited to, a thickness greater than, 5 nm, or 10 nm or 15 nm and/or less than 50 nm, 100 nm, or 1000 nm.

The reflector 46 illustrated shown in FIG. 1E through FIG. 1I can include, consists of, or consists essentially of one or more reflective materials 55 such as a metal. Suitable reflective materials 55 include, but are not limited to, aluminum, titanium, and gold. Metal included in the reflector can be placed on the device using techniques such as evaporation and sputtering. Certain return devices such as metal reflectors can absorb a portion of the pass signal that is incident on the return device. In some instances, the return devices are configured such that the return signal has more than 50% or 70% and/or less than 80% or 100% of the power of the passed signal that was received by the return device.

Figure 1J:
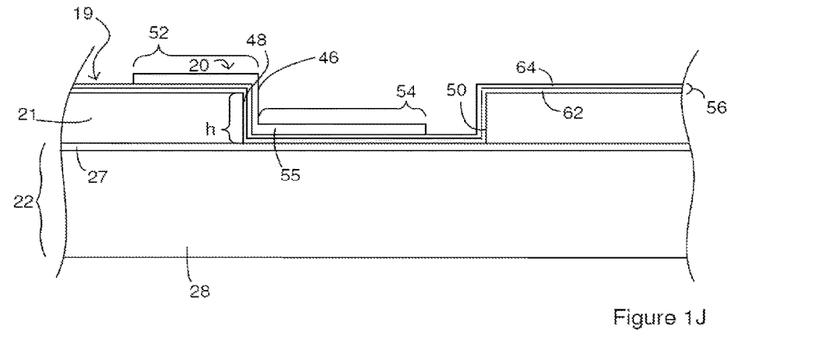
FIG. 1J illustrates the device of FIG. 1H but with an intermediate layer that includes multiple layers of material.

When the light-transmitting medium 21 is silicon, suitable materials for an intermediate layer and/or a cladding layer include, but are not limited to, silicon, polymers, silica, SiN, GaAs, InP, LiNbO$_3$. Although FIG. 1A through FIG. 1I illustrate the intermediate layer and/or cladding as a single layer of material, the intermediate layer and/or cladding can include multiple layers of material. For instance, FIG. 1J illustrates the device of FIG. 1F with an intermediate layer that includes a first layer 62 and a second layer 64. In one example, the first layer 62 is silica and the second layer 64 is silicon nitride. In some instances, the intermediate layer 56 and the insulator 27 are each made of the same material. For instance, the intermediate layer 56 and the insulator can each be silica.

Figure 1K:
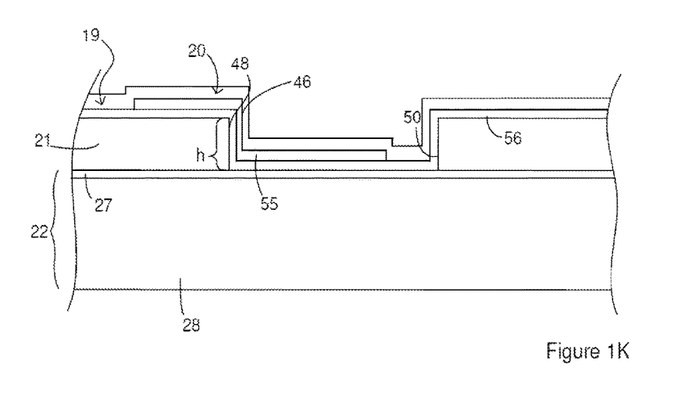
FIG. 1K illustrates a cladding over the device of FIG. 1H.

Although FIG. 1I illustrates the cladding 60 over the optical device of FIG. 1F, the cladding 60 can be positioned over any of the devices illustrated in FIG. 1A through FIG. 1J. For instance, the cladding 60 can be used in conjunction with an intermediate layer 56 that acts as a cladding. For instance, FIG. 1K illustrates a cladding 60 over the device of FIG. 1H or FIG. 1J. In one example of the device accordingly to FIG. 1K, the intermediate layer 56 is a layer of silica and the cladding 60 includes a layer of silica between a layer of silicon nitride and the intermediate layer 56.

Figure 2A:
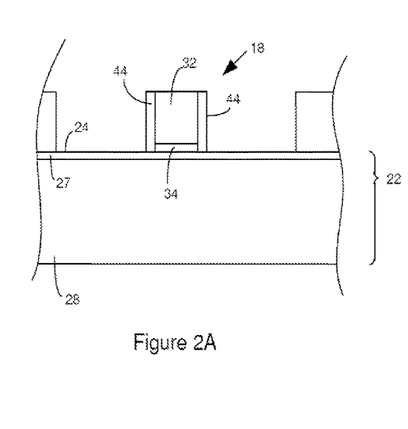
FIG. 2A is a cross-section of a light sensor that employs electrical conductors as field sources.

The light sensor 18 can have a construction other than the construction illustrated in FIG. 1A through FIG. 1K. For instance, rather than using doped regions 40 in the light-absorbing medium 32 as the field sources, electrical conductors 44 such as metal can be used as the field sources. FIG. 2A is a cross-section of a light sensor that employs electrical conductors 44 as field sources. The electrical conductors 44 extend from the base 22 to the top side of the light-absorbing medium 32. For instance, FIG. 2A illustrates the electrical conductors 44 extending from the insulator 27 to the top side of the light-absorbing medium 32. The seed portion 34 of the light-transmitting medium 21 is between the base 22 and the light-absorbing medium 32.

Figure 2B:
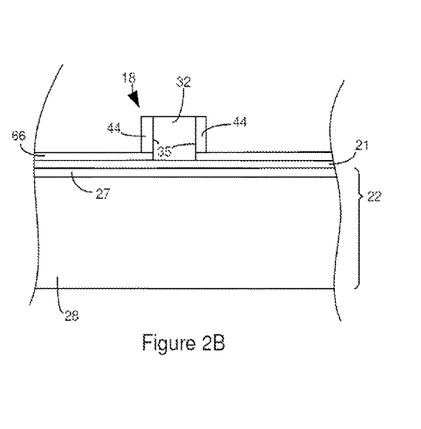
FIG. 2B is a cross-section of a light sensor that employs electrical conductors as field sources. The electrical conductors are elevated above the height of the electrical conductors shown in FIG. 2A.

As is evident from FIG. 2A, the electrical conductors 44 can contact the base 22. However, the electrical conductors 44 can be spaced apart from the base 22 as illustrated in FIG. 2B. In FIG. 2B, a spacer layer 66 is formed on top of the light-transmitting medium 21 and against the lateral sides of the light-absorbing medium 32. The electrical conductors 44 extend from the top of the spacer layer 66 to the top side of the light-absorbing medium 32. As a result, the spacer layer 66 elevates the bottom of the electrical conductors 44 relative to the base 22. The electrical conductors 44 are also elevated above the interface between the light-absorbing medium 32 and the seed portion 34 of the light-transmitting medium 21. The elevation of the electrical conductors 44 reduces interaction between the resulting electrical field and the interface between the light-absorbing medium 32 and the seed portion 34 of the light-transmitting medium 21. This reduced interaction may further reduce the level of dark current associated with the light sensor.

Figure 2C:
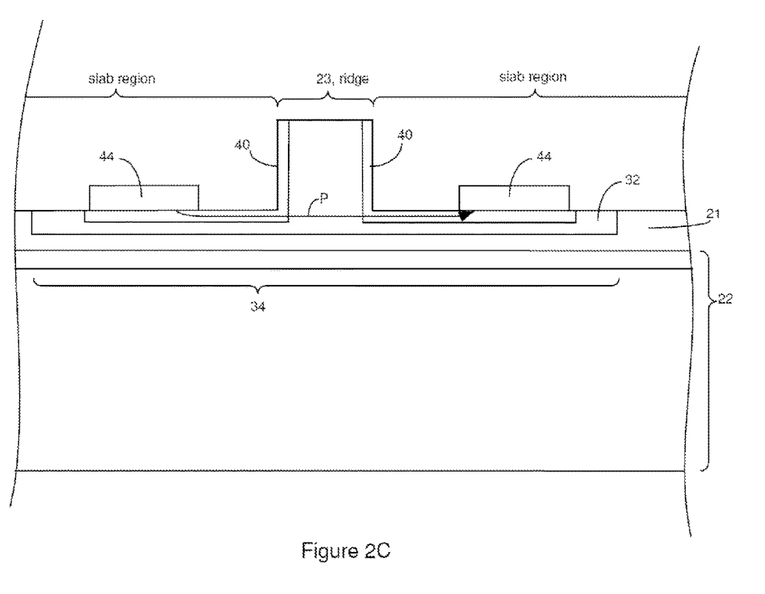
FIG. 2C is a cross-section of a light sensor having a light-absorbing medium positioned such that the doped regions are located only in the light-absorbing medium but excluded from the light-transmitting medium.

FIG. 2C presents another construction of the light sensor that can simplify the fabrication process. A ridge 23 of light-absorbing medium 32 extends upward from a slab region of the light-absorbing medium 32. The slab region of the light-absorbing medium 32 and the ridge 23 of the light-absorbing medium 32 are both positioned on a seed portion 34 of the light-transmitting medium 21. As a result, the seed portion 34 of the light-transmitting medium 21 is between the light-absorbing medium 32 and the base 22. The light-absorbing medium 32 can be grown on the seed portion of the light-transmitting medium 21.

The doped regions 40 of the light-absorbing medium 32 are positioned on the lateral sides of the ridge 23 of the light-absorbing medium 32. The doped regions 40 extend from the ridge 23 into the slab region of the light-absorbing medium 32. The transition of a doped region 40 from the ridge 23 of the light-absorbing medium 32 into the slab region of the light-absorbing medium 32 can be continuous and unbroken as is evident from FIG. 2C.

Electrical conductors 44 are positioned on the slab region of the light-absorbing medium 32. In particular, the electrical conductors 44 each contact a portion of a doped region 40 that is in the slab region of the light-absorbing medium 32.

The arrangement of FIG. 2C may have a simplified fabrication process relative to an arrangement such as illustrated in FIG. 2A. For instance, in FIG. 2A, doped regions 40 are formed in the light-transmitting medium 21 and also in the light-absorbing medium 32. Different conditions may be required to form these regions in the different materials. For instance, when the light-transmitting medium 21 is silicon and the light-absorbing medium 32 is germanium, it may be desirable to use different temperatures to form the doped regions 40 in the light-absorbing medium 32 than is used to form the doped regions 42 in the light-transmitting medium 21. However, since the arrangement of FIG. 2C requires that the doped regions be formed only in the light-absorbing medium, the arrangement of FIG. 2C may be simpler to fabricate.

The arrangement illustrated in FIG. 2C can also be associated with a reduction in dark current as a result of reducing interaction between the resulting electrical field and the interface between the light-absorbing medium 32 and the seed portion 34 of the light-transmitting medium 21. For instance, as can be seen from the arrows labeled P in FIG. 2C, at least a portion of the electrical field formed between the electrical conductors can form on a path through one of the slab regions, through a portion of the light-absorbing medium under the ridge, and then through the slab region without entering the light-transmitting medium. Since the illustrated path does not include the light-transmitting medium, the dark current may be reduced.

Although FIG. 2C illustrates each of the doped regions extending only part way into the light-absorbing medium included in the slab regions, one or more of the doped regions can extend through the light-absorbing medium. Accordingly, one or more of the doped regions can contact the light-transmitting medium 21. Further, one or more of the doped regions can extend through the light-absorbing medium and into the light-transmitting medium 21.

Increasing the portion of the lateral side of the ridge that is contacted by the field source can increase the efficiency of the light sensor. Accordingly, as is evident in FIG. 1A, FIG. 2A, and FIG. 2C, each of the field sources can span the distance between the top of the lateral side contacted by the field source and the bottom of the lateral side contacted by the field source. In some instances, each of the field sources extends from the top of the lateral side contacted by the field source toward the base 22. Alternately, each of the field sources can extend toward the base 22 from a location that is above 90% of a distance between the top of the lateral side contacted by the field source and the bottom of the lateral side contacted by the field source. Each of the field sources can extend toward the base 22 from a location that is above 80% of a distance between the top of the lateral side contacted by the field source and the bottom of the lateral side contacted by the field source. In one example, each of the field sources extends toward the base 22 from a location that is within 1.0 μm of a top of the lateral side contacted by that field source.

Additional details about the structure, fabrication, and operation of light sensors according to FIG. 1A through FIG. 3 can be found in U.S. patent application Ser. No. 12/584,474, filed on Sep. 4, 2009, entitled "Optical Device Having Light Sensor Employing Horizontal Electrical Field," and incorporated herein in its entirety.

Figure 3:
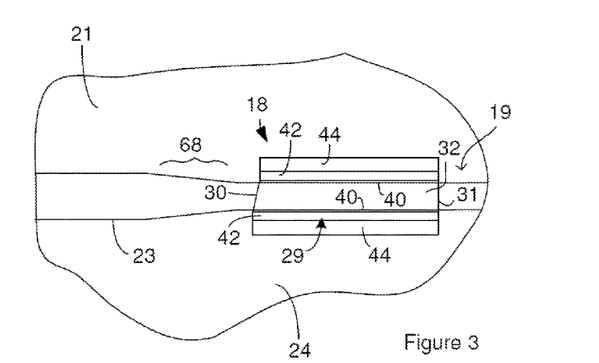
FIG. 3 is a topview of the portion of optical device where the waveguide is interfaced with the light sensor. The waveguide includes a taper.

FIG. 3 is a topview of the portion of an optical device according to FIG. 1 where the waveguide 16 is interfaced with the light sensor. The waveguide includes a taper 68. The taper 68 can be a horizontal taper and need not include a vertical taper although a vertical taper is optional. The taper 68 is positioned before the light sensor. For instance, the horizontal taper occurs in the light-transmitting medium 21 rather than in the light-absorbing medium 32. The taper 68 allows the light-absorbing medium 32 to have a narrower width than the waveguide 16. The reduced width of the light-absorbing medium 32 increases the speed of the light sensor. The optical component preferably excludes additional components between the taper and light sensor although other components may be present. Although FIG. 3 illustrates the light sensor constructed according to FIG. 1B, the light sensor of FIG. 3 can be constructed according to any of the light sensors illustrated FIG. 1A through FIG. 2C.

Figure 4A:
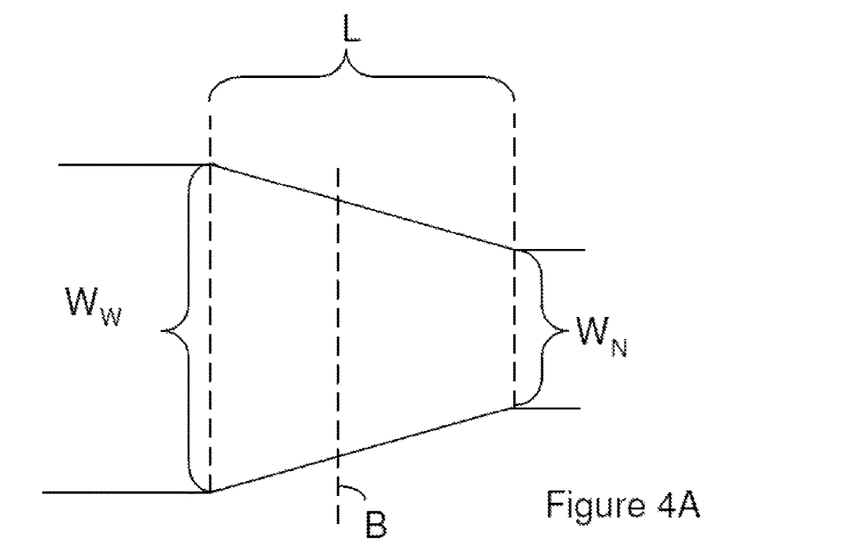
FIG. 4A is a topview of the taper.
Figure 4B:
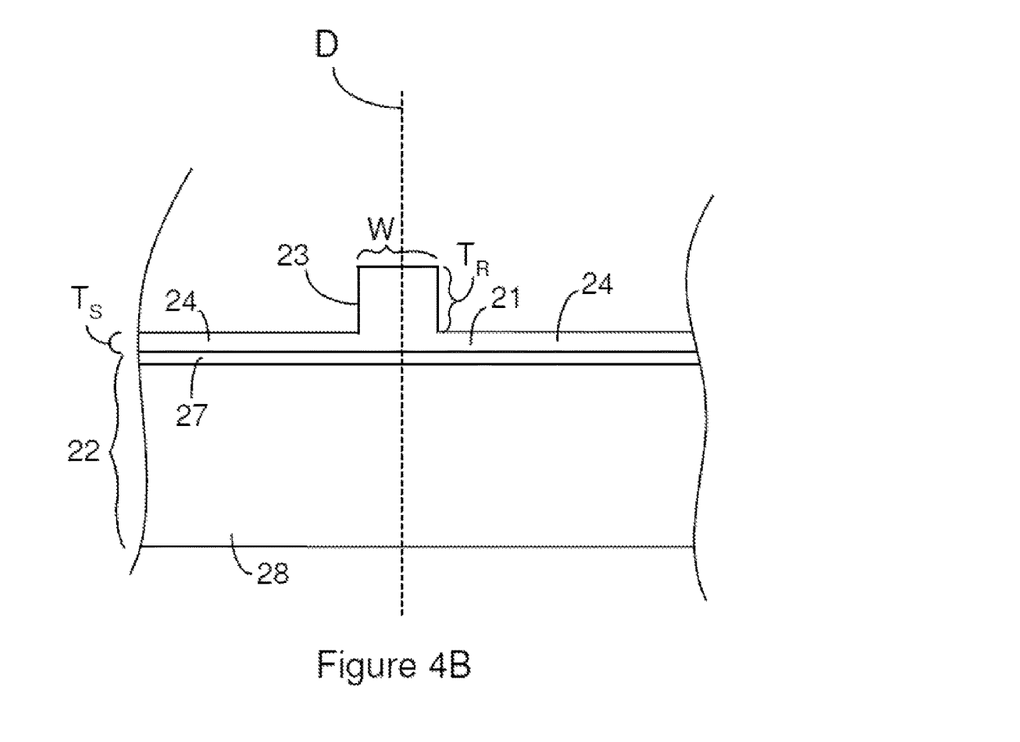
FIG. 4B is a cross section of the taper shown in FIG. 4A taken along the line labeled B in FIG. 4A.

The taper 68 can be an adiabatic taper in order to prevent or reduce the excitation of higher order modes. When higher order modes are excited in single mode waveguides, the higher order modes are normally a source of loss in the system. However, the inventors have unexpectedly found that using an abrupt taper actually increases the sensitivity and/or bandwidth of the light sensor. Without being bound to theory, the increase in sensitivity and/or bandwidth is believed result from the abrupt taper not giving the light signal enough time to move into the lower portion of the waveguide where the sensitivity of the light sensor is reduced. FIG. 4A and FIG. 4B illustrate the dimensions and construction of an abrupt taper according to FIG. 3. FIG. 4A is a topview of the taper and FIG. 4B is a cross section of the taper shown in FIG. 4A taken along the line labeled B in FIG. 4A. The width of the ridge is labeled W in FIG. 4A. The width of the ridge at the wide end of the taper is labeled $W_W$ in FIG. 4A and the width of the ridge at the narrow end of the taper is labeled $W_N$ in FIG. 4B. The length of the taper is labeled L in FIG. 4A. The thickness of the slab regions is labeled $T_S$ in FIG. 4B and the thickness of the ridge is labeled $T_R$ in FIG. 4B.

In order to achieve an abrupt taper, a suitable ratio for the width of the waveguide or ridge at a first location in the taper to the width of the waveguide or ridge at a second location in the taper is greater than 1.1:1, 2.5:1, or 3.5:1 where the distance between the first location and the second location is less than 3 μm, 20 μm, or 40 μm. As an example, a suitable ratio for $W_W:W_N$ is greater than 1.1:1, 2.5:1, or 3.5:1 when L is less than 3 μm, 16 μm, or 40 μm. In one example of a device having the dimensions set out above, the width of the ridge at the wide end of the taper, $W_W$, is greater than 0.5 μm, 2 μm, or 3 μm and/or the width of the ridge at the narrow end of the taper, $W_N$ is greater than 0.2 μm, 0.3 μm, or 0.4 μm and/or less than 0.6 μm, 1 μm, or 1.2 μm In some instances, reducing the slab thickness, $T_S$, relative to the ridge width, W, can also increase the sensitivity and/or bandwidth of the light sensor. A suitable width ratio for $T_S:W$ where W represents the width of the waveguide before the taper is less than 1:6, 1:5, or 1:4. Additionally or alternately, a suitable thickness ratio of slab thickness, $T_S$, relative to the ridge thickness, $T_R$, is greater than 1:30, 1:20, or 1:15 and/or less than 1:10, 1:5, or 1:2. In one example, the device has a slab thickness, $T_S$, less than 0.4 μm, 0.3 μm, or 0.2 μm.

Figure 5:
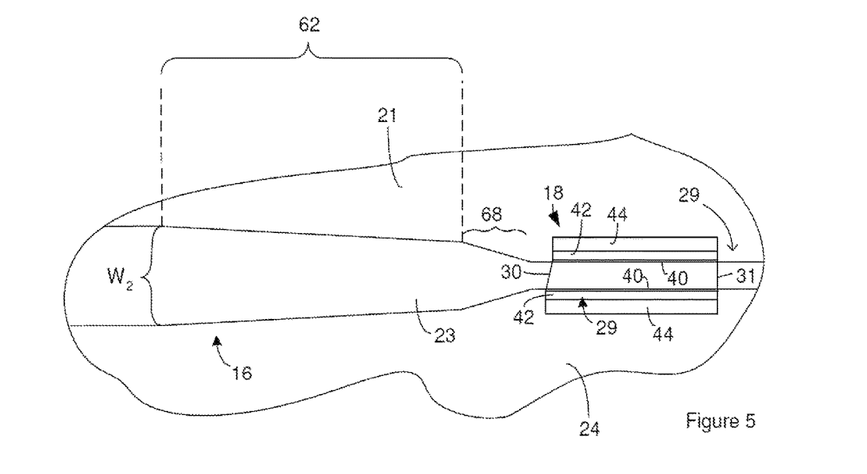
FIG. 5 is a topview of a device that includes an abrupt taper in conjunction with other tapers.

The abrupt taper disclosed above can also be used in conjunction with other tapers as shown in FIG. 5. FIG. 5 illustrates a secondary taper 62 before the abrupt taper discussed above. The width of the ridge at the wide end of the secondary taper 62 is labeled $W_2$. In some instances, the secondary taper 62 is a traditional taper designed to reduce the excitation of higher order modes. As a result, the width of the ridge at the wide end of the abrupt taper, $W_W$, can be narrower than the portion of the waveguide before the secondary taper 62 without the excitation of higher order modes. This arrangement can reduce the level higher order mode excitation relative to what would be achieved if the same degree of tapering were provided by only the abrupt taper. A suitable ratio for the width of the waveguide or ridge at a first location in the secondary taper 62 to the width of the waveguide or ridge at a second location in the secondary taper is less than 6:1, 3:1, or 2:1 where the distance between the first location and the second location is greater than 200 μm, 100 μm, or 50 μm. As an example, a suitable ratio for $W_2:W_W$ is less than 6:1, 3:1, or 2:1 when L is greater than 200 μm, 100 μm, or 50 μm. In one example of a device having the dimensions set out above, the width of the ridge at the wide end of the taper, $W_W$, is less than 2 μm, 1.5 μm, and 0.9 μm and/or greater than 0.7 μm, 0.6 μm, or 0.5 μm. In some instances, the dimensions of the secondary taper 62 are selected such that the secondary taper is an adiabatic taper. The secondary taper 62 can be a horizontal taper and need not include a vertical taper although a vertical taper is optional.

Figure 6:
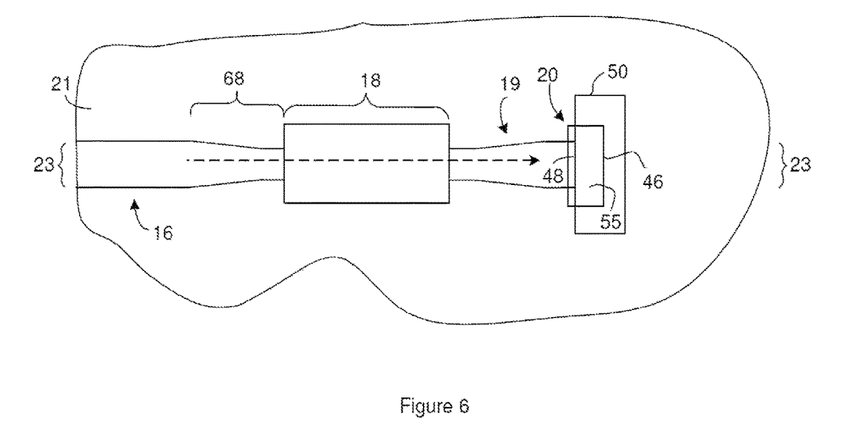
FIG. 6 is a topview of a light sensors positioned midway along an optical path.

The return waveguides 19 in the above devices are illustrated without tapers; however, the return waveguide 16 can include an abrupt taper and/or a secondary taper as disclosed above. As an example, FIG. 6 illustrates a device with a return waveguide 19 that includes a taper. The taper can be a taper such as the abrupt taper disclosed above or the secondary taper disclosed above. Any of the light sensors disclosed above can serve as the light sensor of FIG. 6.

Figure 7:
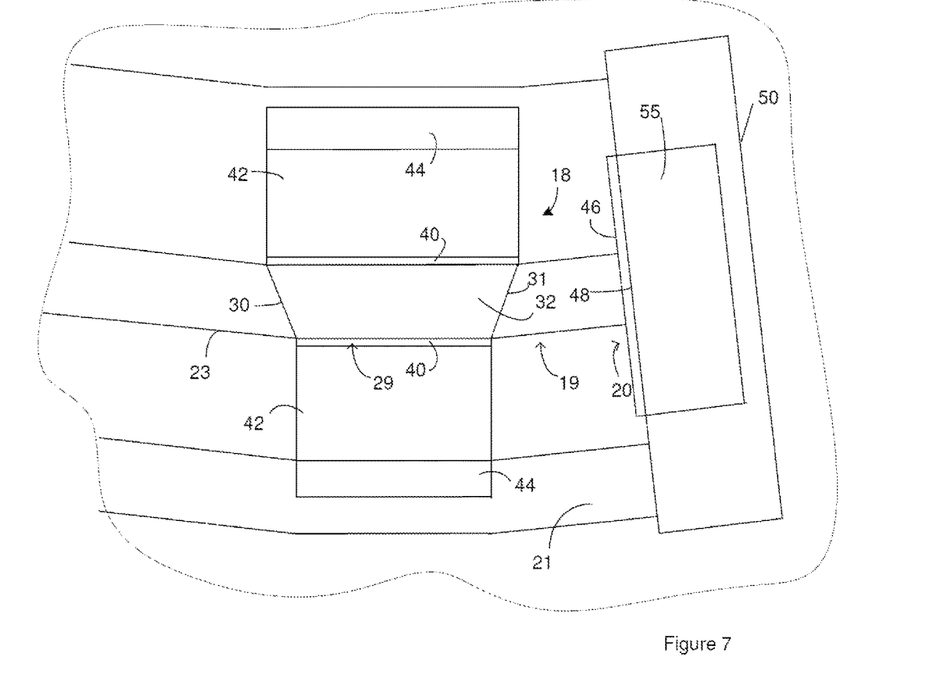
FIG. 7 is a topview of a device where a waveguide and a sensor waveguide intersect at an angle other than 180°.

The above illustrations show a straight intersection between the sensor waveguide 29 and the other waveguides; however, one more of these intersections can have waveguides that intersect at an angle other than 180°. As an example, FIG. 7 is a topview of a device where the waveguide 16 and the sensor waveguide 29 intersect at an angle less than 180°. Additionally, the return waveguide 19 and the sensor waveguide 29 intersect at an angle less than 180°. The particular angle at the intersection of these waveguide can be selected to reduce optical loss from optical effects such as refraction. In some instances, the angle is greater than 150°, 160°, or 170° and/or less than 175°, or 180°. Although FIG. 7 illustrates the waveguide 16 and the return waveguide excluding tapers, the waveguide 16 and/or the return waveguide 19 can each include one or more tapers as disclosed above.

The use of a return waveguide 19 is desirable because it allows the return device 20 to be positioned remotely from the light sensor 18. As a result, the presence of the return device does not interfere with operation of the light sensor 18. For instance, when the return device 20 includes or consists of metals or other electrically conducting materials, these materials do not interfere with operation of the light sensor 18. As an example, the return device does not short the doped regions 40 in a light sensor constructed according to FIG. 1B. The return waveguide 19 can be configured such that the shortest distance between the output facet 31 and the return device is greater than 10, 20, or 30 µm and/or less than 40, 50, or 60 µm In each of the devices disclosed above, the return waveguide 19 is optional. In some instances, the device includes a return system that excludes any return waveguide 19. For instance, the return system can include a return device 20 that receives the passed signal from the sensor waveguide 29 rather than from the return waveguide 19. The return device 20 can receive the passed signal directly from the sensor waveguide 29. In these instances, the electrical conductors in the light sensor can be spaced apart from the return device 20 in order to prevent the return device 20 from interfering with the operation of the light sensor.

Figure 8A:
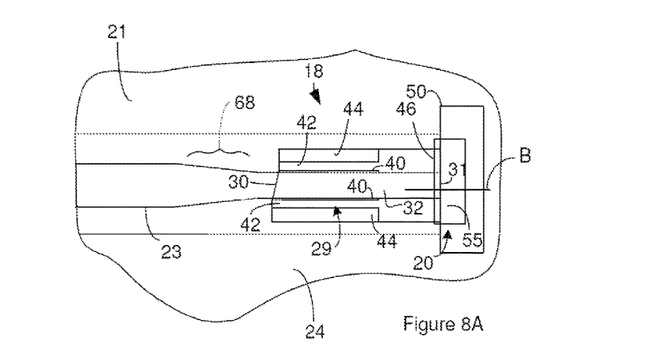
FIG. 8A is a topview of the device.
Figure 8B:
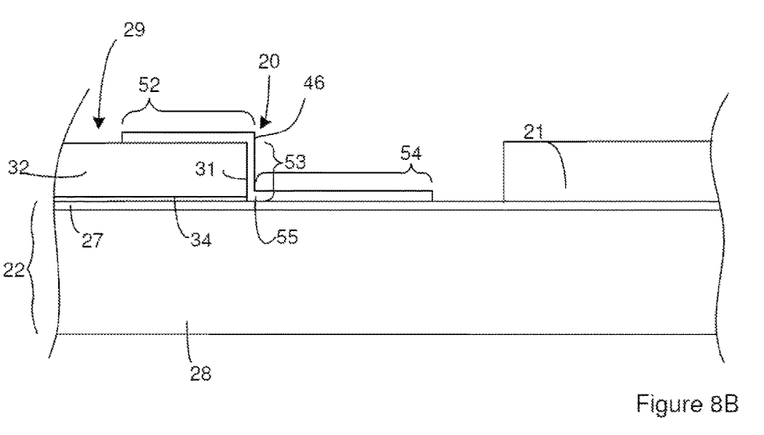
FIG. 8B is a cross section of the device shown in FIG. 8A taken along the line labeled B in FIG. 8A.

As an example, FIG. 8A and FIG. 8B illustrate a device that excludes a return waveguide between the sensor waveguide 29 and the return device 20. FIG. 8A is a topview of the device and FIG. 8B is a cross section of the device shown in FIG. 8A taken along the line labeled B in FIG. 8A. The illustrated device includes the light sensor of FIG. 1B although other light sensors can be employed.

During operation, the light sensor outputs the unabsorbed portion of the light signal through an output facet 31 of the sensor waveguide 29. The unabsorbed portion of the light signal serves as the passed signal and at least a portion of the passed signal is received by the return device 20. No waveguides, optical components, or electrical components are located between the sensor waveguide 29 and the return device 20. As a result, the passed signal experiences no additional processing between the return device 20 and the sensor waveguide 29. As an example, the passed signal does not experience amplification, attenuation, or modulation along the optical pathway between the return device 20 and the sensor waveguide 29. In some instances, the return device 20 receives more than 50% of the power of the passed light signal that entered the return waveguide. The return device 20 returns at least a portion of the received portion of the passed light signal to the sensor waveguide 29. At least a portion of the returned light signal enters the light sensor through the output facet 31. Accordingly, the returned light signal can be fully or partially absorbed by the light-absorbing medium 32.

The illustrated return device 20 is positioned to receive the passed light signal from the sensor waveguide 29. For instance, the illustrated return device is a reflector 46 positioned on the output facet 31 of the sensor waveguide 29. All or a portion of the terminal end of the sensor waveguide 29 can optionally be exposed by a recess 50 that extends into the light-transmitting medium 21. A side of the recess 50 can serve as the terminal end of the sensor waveguide 29 and can include the output facet 31. FIG. 8B illustrates the recess 50 extending through the light-transmitting medium 21 to the base 22. For instance, the optical insulator 27 or substrate 28 can serve as the bottom of the recess and/or the recess 50 can be constructed so there is no light-transmitting medium 21 in the recess 50. Alternately, the recess 50 does not extend through the light-transmitting medium 21 and the recess 50 includes a layer of the light-transmitting medium 21 over the bottom of the recess 50. The recess 50 can be formed with traditional integrated circuit fabrication techniques and/or traditional optical device fabrication techniques such as etching.

The reflector 46 is positioned on the output facet 31. The reflector 46 is shown in direct contact with the light-absorbing medium 32 that defines the output facet 31; however, the sensor waveguide 29 can include one or more additional layers between the light-absorbing medium 32 and the reflector 46. For instance, the intermediate layers 56 discussed above can define the facet 31 of the sensor waveguide 29 and be positioned between the sensor waveguide 29 and the reflector 46. When the intermediate layer 56 is between the reflector 46 and the light-absorbing medium 32, the reflector 46 can be at a distance of less than 20 nm, 30 nm, or 60 nm from the light-absorbing medium 32. In some instances, the reflector 46 is positioned over or covers more than 20%, 50%, or % of the height of the output facet 31.

The electrical conductors included in the light sensor are spaced apart from the return device 20. For instance, in FIG. 8A, the doped regions 40 of the light sensor 18 are spaced apart from the return device 20. The spacing is generally such that the electrical conductors included in the light sensor are electrically insulated from the return device 20. As a result, the return device 20 does not interfere with the operation of the light sensor. In general, the shortest distance between return device 20 and the electrical conductors included in the light sensor or between return device 20 and the electrical conductors for operating the light sensor is greater than 10, 20, or 30 µm and/or less than 40, 50, or 60 µm.

The return system can be constructed such that the returned signal enters the light sensor with more than 50%, or 70% and/or less than 80%, or 100% of the power of the passed signal.

The waveguide 16 and the sensor waveguide 29 can each be a single mode waveguide or can each be a multimode waveguide. When the device includes a return waveguide 19, the return waveguide 19, can be single mode waveguide or a multimode waveguide. In some instances, the waveguide 16, the sensor waveguide 29, and the return waveguide 19 are each a single mode waveguide or are each a multimode waveguide. In some instances, one or two of the waveguides selected from the group consisting of the waveguide 16, the sensor waveguide 29, and the return waveguide 19 is a single mode waveguide and the other waveguides are multimode waveguides.

As noted above, the device is suitable for use in communications applications. Accordingly, a suitable height (labeled h in FIG. 1C) for the waveguide 16 before and/or after any tapers includes, but is not limited to, heights greater than 1 µm, 2 µm, and 3 µm. A suitable width for the waveguide 16 (labeled w in FIG. 1C) includes, but is not limited to, widths greater than 0.3 µm, 1 µm, and 3 µm. Suitable waveguide dimension ratios (width of the waveguide 16:height of the waveguide 16) include, but are not limited to, ratios greater than 0.1:1, 0.3:1, and 0.5:1 and/or less that 0.7:1, 1:1, and 2:1. A suitable thickness for the slab regions adjacent to the waveguide includes, but is not limited to, a thickness greater than 0.1 µm, 0.2 µm, or 0.3 µm and/or less than 0.4 µm, 0.5 µm, or 1 µm. Although these dimensions are disclosed in the context of waveguide 16, when the device includes a return waveguide 29, these dimensions can apply to the return waveguide 29 before and/or after any tapers.

The increased dimensions of the waveguide 16 are also associated with increased dimensions of the light-absorbing medium 32. For instance, a suitable height for the light-absorbing medium 32 (labeled H in FIG. 1B) includes, but is not limited to, heights greater than 1 µm, 2 µm, and 3 µm. A suitable width for the light-absorbing medium 32 (labeled W in FIG. 1B) includes, but is not limited to, widths greater than 0.3 µm, 0.5 µm, and 1 µm. Suitable light-absorbing medium 32 dimension ratios (width of the waveguide 16:height of the waveguide 16) include, but are not limited to, ratios greater than 0.1:1, 0.3:1, and 0.5:1 and/or less than 0.7:1, 1:1, and 2:1. A suitable thickness for the slab regions adjacent to the light-absorbing medium 32 includes, but is not limited to, a thickness greater than 0.1 µm, 0.15 µm, or 0.2 µm and/or less than 0.25 µm, 0.3 µm, or 0.35 µm.

Although the above devices illustrate a reflector layer 55 as the return device 20, other return devices 20 can be used. For instance, the return device 20 can be a reflective grating such as a Bragg grating. In some instances, these gratings can be formed directly in the sensor waveguide 29 or in the return waveguide 19. A reflective optical grating such as a Bragg grating may be desirable because it can provide selectivity for the wavelengths of light that are returned to the light sensor.

When the device includes a interface between the input facet 30 of the light-absorbing medium 32 and a facet of the light-transmitting medium 21 and/or between the output facet 31 of the light-absorbing medium 32 and a facet of the light-transmitting medium 21, the interface can have the light-absorbing medium 32 in direct contact with the light-transmitting medium 21 or one or more other layers of material can be positioned between the light-absorbing medium 32 and the light-transmitting medium 21. For instance, the interface can include one or more anti-reflective layers between the light-absorbing medium 32 and light-transmitting medium 21.

The device disclosed above can be fabricated using fabrication techniques that are commonly used in the fabrication of integrated circuits, optical devices, and optoelectronic devices.

The return system disclosed above can be employed in conjunction with light sensor structures other than the disclosed light sensors. For instance, the light sensor can be include a charge layer such as is disclosed in U.S. patent application Ser. No. 12/589,501, filed on Oct. 23, 2009, entitled "System Having Light Sensor with Enhanced Sensitivity," and incorporated herein in its entirety.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
a light sensor configured to detect light signals,
the light sensor being positioned on a base,
the light sensor being configured to receive an input light signal and then output a portion of the received input light signal as a passed light signal; and
a return system located on the base such that the return system receives the passed light signal from the light sensor and returns at least a portion of the light from the passed light signal back to the light sensor.

2. The device of claim 1, wherein the light sensor includes a sensor waveguide that guides an input light signal through the light sensor, the sensor waveguide including a light-absorbing medium.

3. The device of claim 2, wherein the return system includes a return waveguide that receives the passed light signal from the sensor waveguide, the sensor waveguide including a light-absorbing medium, and the return waveguide excluding the light-absorbing medium.

4. The device of claim 2, wherein the return system includes a return waveguide that receives the passed light signal from the sensor waveguide.

5. The device of claim 4, wherein the return system includes a reflector that receives at least a portion of the passed light signal from the return waveguide and reflects at least part of the received portion of the passed light signal back into the return waveguide.

6. The device of claim 5, further comprising an intermediate layer between the reflector and a facet of the return waveguide.

7. The device of claim 6, wherein the intermediate layer contacts the facet of the return waveguide.

8. The device of claim 5, wherein the intermediate layer is positioned over at least a portion of the return waveguide such that the at least a portion of the return waveguide is between the intermediate layer and the base.

9. The device of claim 4, wherein a shortest distance between the return system and a facet of the sensor waveguide is less than 60 µm.

10. The device of claim 5, wherein the passed light signal does not experience attenuation, modulation, or amplification between the sensor waveguide and the return system.

11. The device of claim 5, wherein the return waveguide is a ridge waveguide and the return system is positioned on more than 50% of a height of a facet of the return waveguide, wherein the height of the facet is measured relative to the base.

12. The device of claim 2, wherein the return system returns at least a portion of the light from the passed light signal back to the sensor waveguide.

13. The device of claim 12, wherein there are no optical waveguides on an optical path that the passed light signal travels between the sensor waveguide and the return system.

14. The device of claim 1, wherein the light sensor, base and return system are included in a planar optical device.

15. The device of claim 1, wherein an optical pathway that the passed light signal travels away from the light sensor is the same as an optical pathway along which the returned light travels to the light sensor.

16. An optical device, comprising:
a light sensor configured to detect light signals,
the light sensor being positioned on a base, and
the light sensor configured to output a passed light signal; and
a return system located on the base such that the return system receives the passed light signal from the light sensor and returns at least a portion of the light from the passed light signal back to the light sensor,
the return system including a return waveguide that receives the passed light signal from the light sensor, and
the return system including a reflector that receives at least a portion of the passed light signal from the return waveguide and reflects at least part of the received portion of the passed light signal back into the return waveguide.

17. The device of claim 16, wherein the light sensor, base and return system are included in a planar optical device.

18. An optical device, comprising:
a light sensor configured to detect light signals,
the light sensor being positioned on a base, and
the light sensor configured to output a passed light signal; and
a return system located on the base such that the return system receives the passed light signal from the light sensor and returns at least a portion of the light from the passed light signal back to the light sensor, and
the light sensor, base and return system being included in a planar optical device.

19. The device of claim 1, wherein the light sensor is configured to convert the input light signal to an electrical signal.

20. The device of claim 1, wherein the light sensor being configured to detect the light signals is the light sensor being configured to detect a power level of the light signals.

* * * * *